United States Patent [19]
Chapman

[11] Patent Number: 5,021,753
[45] Date of Patent: Jun. 4, 1991

[54] SPLATTER CONTROLLED AMPLIFIER
[75] Inventor: Ronald H. Chapman, Carol Stream, Ill.
[73] Assignee: Motorola, Inc., Schaumburg, Ill.
[21] Appl. No.: 562,360
[22] Filed: Aug. 3, 1990
[51] Int. Cl.$^5$ .......................... H03C 3/08; H04B 1/04
[52] U.S. Cl. ..................................... 332/103; 332/123; 455/126
[58] Field of Search ............... 330/129, 149, 279, 284; 332/103, 123; 455/114, 115, 126

[56] References Cited
U.S. PATENT DOCUMENTS
4,618,999 10/1986 Watkinson ...................... 455/126 X
4,700,151 10/1987 Nagata ................................ 332/123
4,843,351 6/1989 Edwards et al. ..................... 332/103
4,933,986 6/1990 Leitch .............................. 455/126 X Primary Examiner—Steven Mottola
Attorney, Agent, or Firm—Joseph P. Krause

[57] ABSTRACT

An amplifier circuit uses a microprocessor to count occurrences of the output stage going into saturation to decide when to control input levels to the amplifier. When the output amplifier stage saturates too frequently, the microprocessor controls a scaling line that effectively attenuates input levels to the amplifier, eliminating saturation levels. When the output stage saturates too infrequently, input levels to the amplifier are increased.

14 Claims, 1 Drawing Sheet

5,021,753

SPLATTER CONTROLLED AMPLIFIER

BACKGROUND OF THE INVENTION

This invention relates to electronic amplifiers. In particular, this invention relates to amplifiers, including radio frequency signal amplifiers, that are linearized by using negative feedback.

When an amplifier circuit is used to amplify signals having a high peak power level to average power level power ratio (high peak-to-average power ratio) it is desirable to operate the amplifier at the highest average power level possible. (Voice signals have a high peak to average signal power ratio as well as certain types of quadrature modulation signals, typically used with digital signals.) When an amplifier saturates on modulation peaks, the linearizing effect of negative feedback is lost and it can generate harmonics or other spurious signals. If a saturated amplifier is used in communications applications where there may be several frequency-adjacent communications channels, the harmonics and other spurious outputs caused by the overdriven amplifier can spill over or splatter into channels occupying adjacent frequencies adversely affecting signals in adjacent frequency channels. Controlling or limiting the saturation of an amplifier used in such applications can avoid this adjacent channel signal splatter.

It is desirable to operate an amplifier at as high an output power level as possible without overdriving the amplifier. A negative feedback amplifier that is capable of dynamically adjusting input signal levels to the amplifier in response to the rate of occurence of saturation would be able to maintain maximum output power levels while minimizing spurious signals caused by saturation.

SUMMARY OF THE INVENTION

There is provided herein a radio transmitter that includes a negative feedback amplifier circuit that adjusts input signal levels from a signal source according to the rate of occurence of an error signal exceeding a reference level, which is indicative of the amplifier's saturation. The negative feedback amplifier circuit adjusts input signal levels from the signal source according to the rate of occurence at which the amplifier's error signal indicates that the amplifier has gone into saturation.

In the preferred embodiment, the transmitter includes circuitry to frequency shift the baseband frequency information-bearing signals to radio frequencies that are amplified. The RF signals are sampled, shifted back to baseband frequencies, and combined with the original information signal to provide an error signal that is tested to determine if the amplifier is being overdriven.

(In a negative feedback amplifier, some of the amplifier's output signal is sampled and subtracted from the signal input to the amplifier to provide an error signal. As long as the amplifier output is reasonably linear, the magnitude of the error signal is small. During the time that the amplifier is saturated, the magnitude of the error signal increases substantially.)

The amplifier circuit taught herein continually adjusts input signal levels to the amplifier in such a way that when the amplifier output stage saturates or has been driven into saturation more often than some maximum number of times per second, other circuitry reduces input signal levels to reduce saturation occurence. If the amplifier's output signal is not detected as being at or near saturation, input levels to the amplifier are increased to maximize the available output power from the amplifier. If the rate of saturation occurences is kept between appropriate minima and maxima, the capability of the power amplifier is used to its fullest capability and frequency splatter and other spurios emissions caused by overdriving the amplifier can be minimized.

DETAILED DESCRIPTION OF THE PREFERRED EMBODIMENT

Figure 1:
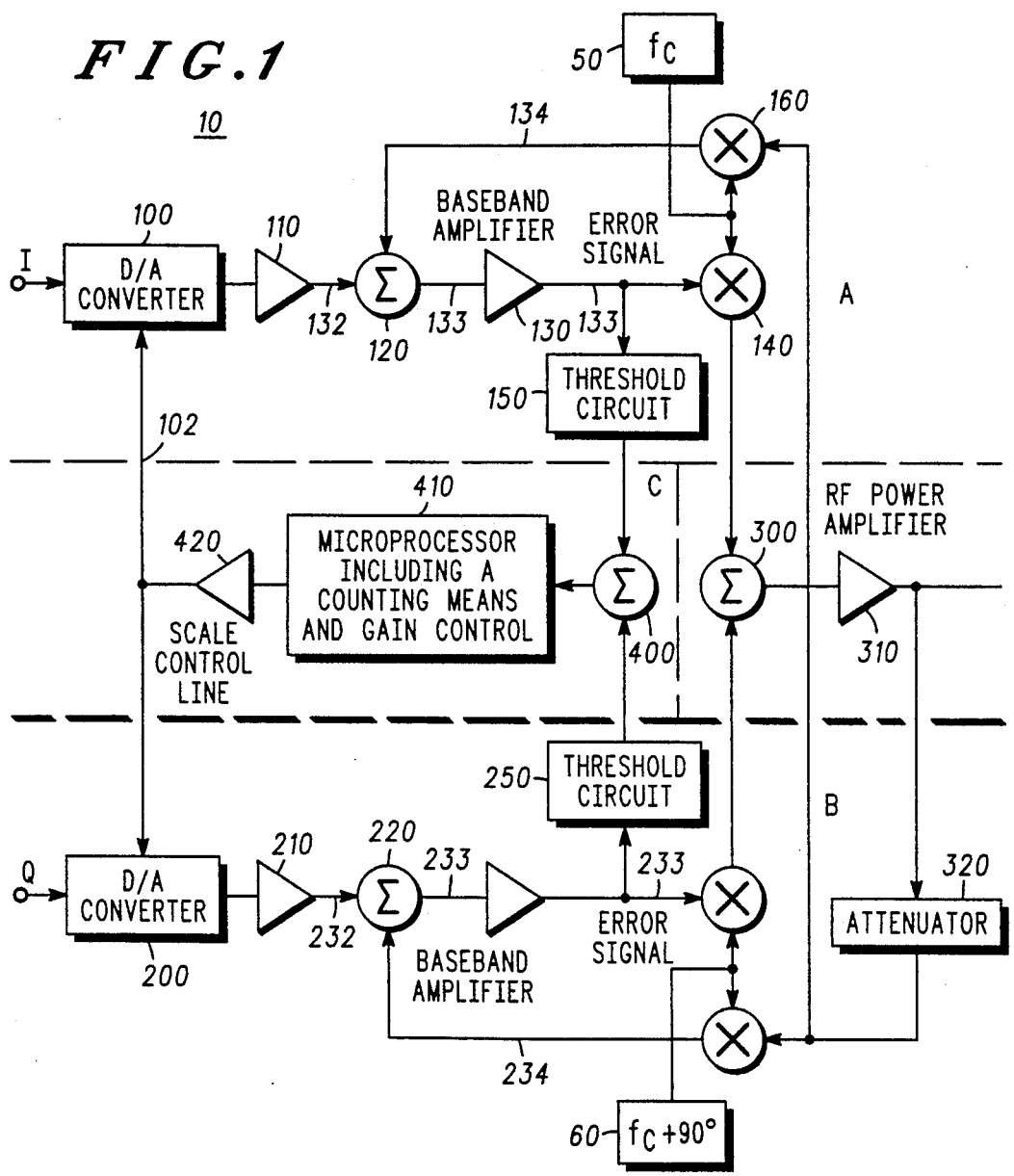
FIG. 1 shows the diagram of a splatter controlled AGC amplifier.

FIG. 1 shows a block diagram of a splatter-controlled amplifier/transmitter (10) utilizing a Cartesian feedback linear amplifier. The circuit shown in FIG. 1 includes circuitry to up-shift baseband signals to radio frequencies, amplify these for transmission from an antenna, and, down-shift RF signals from the amplifier stage (310) back to baseband to control final amplifier distortion. The circuit (10) is primarily intended to amplify a so-called phase quadrature signal comprised of in-phase components (I component) and phase-quadrature components (Q component). The concepts disclosed herein in the amplifier circuit (10) could be used for providing AM, FM, SSB, or other types of modulation.

An essential feature of the amplifier shown in FIG. 1, as well as vitually all linear amplifiers, is a negative feedback loop. In FIG. 1, the negative feedback loop includes an attenuator (320), two multiplier circuits (160 and 260 respectively) the outputs of which are coupled to different summing circuits (120 and 220), two amplifiers, (130 and 230), the outputs of which are coupled to multipliers (140 and 240 respectively), the outputs of which are coupled to summer 300, the output of which is coupled to the input of the RF power amplifier (310). Some of the output of the RF amplifier (310) is coupled to the attenuator (320) to complete the feedback loop. (In order to have a negative feedback loop, at least one element in this feedback loop must provide an inversion of the signal present at the output of the final amplifier (310)).

In FIG. 1, the multipliers 140 and 160 receive as an input signal, a local oscillator signal $f_c$, while multipliers 240 and 260 receive as an input, a second oscillator signal, $f_c+90$ degrees. Multipliers 140 and 240, are used to modulate their respective local oscillator signals, $f_c$ and $f_c+90$ degrees. Multipliers 160 and 260, are used to de-modulate the output signal from the attenuator (320) using their respective local oscillator signals, $f_c$ and $f_c+90$ degrees. The outputs of the baseband error signal amplifiers (130 and 230), are sampled by signal sampling circuits (150 and 250 respectively).

It can be seen that the amplifier (10) is comprised of two virtually identical circuit halves denoted A and B, both of which are coupled to a counting block C by means of the threshold circuits (150 and 250).

Referring now to the first portion, or half, of the amplifier circuit (10), portion A, a signal denoted as I and in this embodiment a digital signal and corresponding to the in phase component of the quadrature signal is coupled to a digital to analog converter, (D/A) that has an output scaling line. This D/A is a so-called scalable digital to analog converter. The output scaling line (102) can be used to adjust the output level or magnitude of the analog output signal from the D/A. The D/A converter (100) converts a digital signal to an analog signal using any appropriate digital to analog conversion process, many of which are well known in the art. (In this case, the D/A converts the digital I signal to an analog I signal.)

A first intermediate amplifier stage (110) can be used to boost the signal level from the digital-to-analog converter (100) prior to being summed in a summing network (120). This first intermediat amplifier stage (110) could provide either voltage amplification or current amplification. This first intermediate amplifier (110) might also be used for impedance matching purposes as well, matching, or isolating, the output impedance of the D/A converter (100) to that of the summing network (120). Note that if the magnitude of the D/A output is sufficient, the output of the D/A might be directly coupled to the summing network (120).

The summing network (120) receives two signal components; one from the D/A converter (100) and one from a multiplier (160). The output of the summing block 120, which is considered the baseband error signal and which is substantially equal to the algebraic difference of the two signals input to the summing block (120), is coupled to the baseband error signal amplifier (130). The baseband error signal amplifier (130) boosts the signal level from the summing network (120) prior to the error signal's modulation in the multiplier circuit (140). (The carrier frequency $f_c$, used by the multipliers 160 and 140 is generated by the local oscillator (50) as shown.) A multiplicative product of the oscillator (50) frequency $f_c$ and the baseband error signal frequency is the frequency of the RF signal (assuming that, as shown in FIG. 1, there is no additional modulation or frequency shifting).

Ignoring the summing network 300, the output of the multiplier block (140) is coupled to the RF power amplifier stage (310) for subsequent broadcast or other use. (The summing network 300 adds the output from the multiplier 140 to the output of the multiplier 240 to produce a signal that is a composite of I and Q signals. This composite I and Q signal is then coupled to the amplifier 310 for subsequent broadcast. In the foregoing discussion of the A portion of the amplifier (10) however, the second, B portion of the amplifier (10) was omitted for simplification. The B portion, which includes substantially the same stages albeit used only for the Q or quadrature component of the I and Q components, would function substantially the same way. Omission of the Q signal input to the summing network 300 would still result in the I signal being coupled to the amplifier stage 310.)

It can be seen that the output of the amplifier stage (310) is sampled by an attenuation network (320) as shown. The attenuation network (320) could be a resistive network, such as a resistive voltage divider. In the preferred embodiment, the attenuation network (320) included a directional coupler and resistive attenuator.

It can be seen that the output of the attenuator stage (320) is coupled to both A and B halves of the amplifier circuit (10) because both circuit halves modulate the I and Q signal levels input to the amplifier (310) to control its saturation. Still ignoring circuit B momentarily, it can be seen that the attenuator (320) output is coupled to the multiplier block (160). As stated above, the multiplier (160) de-modulates the signal output from the attenuator (320), by the carrier frequency $f_c$ to reproduce the baseband signal (134). The output of the multiplier (160) is coupled to the second input of the summing network (120) discussed above, the result of which is the error signal (133).

It should be noted that the first input to the summing network 120 is the output from the D/A converter and is the baseband signal (132) without distortion from the amplifier 310. The second input to the summing network 120 is the baseband signal (134) that includes distortion, if any, produced by the RF power amplifier 310. The output of the summing network 120 is the difference between them, and is the baseband error signal.

If the output of the amplifier 310 has no distortion, the signal to the second input of the summing network 120 will be virually identical to the signal to the first input, i.e. the output of the D/A and the baseband error signal will be an attenuated version of the output of the D/A. It can be seen that the output of the summing network 120 is dependent upon the feedback signal from the multiplier 160 that is in turn dependent upon the distortion produced by the amplifier stage 310.

(It should be noted that the output of the summing circuit (120) is substantially equal to the baseband signal (132) from the D/A, minus an attenuated copy of the de-modulated output from the amplifier (310). Since the summing circuit contemplated in the preferred embodiment adds signals that have opposite polarities, i.e. provides an algebraic sum, an inversion of the baseband signal (132) output from the summing circuit 120 is required of either the summing circuit 120, the amplifier 130 or the final amplifier 310 to provide a signal of the correct polarity at the second input to the summer 120.)

While the foregoing discussion is of the A portion of the amplifier circuit (10), the elements in the B portion operate identically albeit on the phase-quadrature signals, i.e., the Q-signal. As such the amplifier stage (10) shown in FIG. 1 is capable of minimizing distortion in a so-called phase-quadrature signal while maximizing output power levels from the amplifier (10).

Output stage distortion control is achieved by means of the third portion of the amplifier circuit, the C portion. A threshold sampling circuit (150), which in the preferred embodiment is an analog comparator circuit, produces an output pulse when the absolute value of the error signal (133) exceeds a predetermined threshold value. The threshold sampling circuit (150), which might be considered a threshold comparator, could for example be either a voltage comparator or a current comparator as required. Stated alternatively, the threshold circuit output (150) is a stream of pulses the frequency of which varies according to the rate of occurence at which the absolute value of the error signal (133) exceeds some predetermined value. (The error signal (133) will exceed this value only when the amplifier stage (310) is overdriven or saturated.)

Ignoring momentarily the summing stage (400) and turning only to the microprocessor (410) and scaling control circuit (420), in the preferred embodiment the microprocessor (410) counts the occurrences of pulses from the threshold circuit (150) and generates an output signal to the scale control circuit driver (420) that adjusts the output of the amplitude of the D/A convertor (100).

Using the second negative feedback loop comprised of the threshold circuit (150), the microprocessor (410), the scaling control circuit (420) and D/A convertor (100) the level of the signal input to the amplifier (310)

can be controlled in such a way that splatter from over driving the amplifier (310) is dynamically controlled.

The circuits shown in FIG. 1 is particularly well suited to linear amplification of signals modulated with high peak to average signal power ratios because the microprocessor and scalable D/A dynamically adjusts the input level to the RF power amplifier stage (310).

When the amplifier circuit (10) is used to amplify so-called phase quadrature signals, both circuit halves, A and B are controlled by the counting circuitry (comprised of the summing network (400), the microprocessor (410), and the scaling control circuit (420) (to insure that the output of the RF power amplifier stage (310) does not saturate too often so as to cause undesirable distoration signal).

Since both circuit halves, A and B, operate virtually identically, it can be seen from an inspection of FIG. 1 that the quadrature signal Q is input to a second D/A convertor (200) that functions identically to the first D/A converter (100).

In the B circuit the error signal (233) is also sampled by a threshold comparative circuit (250), the output of which is also a train of pulses having a frequency corresponding to the rate at which the RF power amplifier stage (310) saturates due to Q signal components. Both threshold circuits (150 and 250) are coupled to the summing network (400), the output of which the microprocessor (410) monitors, to count pulses attributable to overdriving the amplifier stage (310) by either the in-phase or quadrature phase signal portions. In this way the microprocessor (410), can adjust both D/A convertors (100 and 200) to prevent signal distortions by overdriving the RF power amplifier stage (310). On the other hand, if the rate of pulses from the summing network (400) falls below some minimum level, the amplifier might be considered under-driven. If the rate of pulses from the summing network falls below this threshold, the microprocessor (410) increases the signal level out of the D/A converters (100 and 200) more fully utilizing the capability of the amplifier (310). The threshold rate above which signals from the D/A's to the amplifer (310) are reduced and the threshold rate below which signals from the D/A's to the amplifier are increased can be selected as desired. These two thresholds might even be equal.

Since the circuit shown at FIG. 1 is used with in phase and phase quadrature signals, the circuit requires, of course, the local oscillator $f_c$ from the oscillator source (50) and a ninety degree phase shifted version (60) obtained either a second oscillator source $f_c+90$ or a phase shifted version of the first $f_c$.

The design of the first amplifier stages (110 and 210) are not critical, and might include for example discreet transistor amplifiers, operational amplifiers. The summing circuits (120 and 220) may be accomplished by using operational amplifier circuit techniques for example, or, resistive circuit elements.

Similar to the first amplifier stages (110 and 210), the baseband amplifiers (130 and 230) might include operational amplifiers, discreet transistors or the like.

The threshold comparative circuits (150 and 250) would typically include analog voltage comparators, well known in the art. Alterante embodiments could include an analog to digital conversion of the error signals (133 and 233) followed by a digital comparator stages.

The microprocessor (410) may be any conveniently chosen microcontroller or microcomputer well known in the art. An output line from the microprocessor (410) can be used to toggle a scaling control circuit (420), which might include a D/A converter, to adjust the scaling output of the digital analog output converters.

The RF power amplifier stage (310) may be any appropriate type of amplifier running in any class suitable for the type of linear modulation contemplated for the circuit (10).

Figure 2:
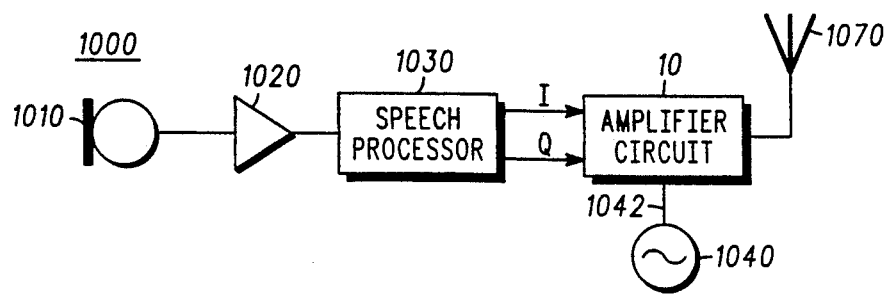
FIG. 2 shows a block diagram of a transmission system using the amplifier of FIG. 1.

A simplified radio transmission system (1000) that is intended to broadcast an information-bearing signal on an RF channel, that might have adjacent-frequency RF channels is shown in FIG. 2. (The adjacent frequency channels being susceptible to interference caused by an over-driven amplifier stage in a transmitter operating on a nearby-frequency channel.) This system uses the amplifier circuit (10) shown in FIG. 1. This radio transmitter receives audio or voice information signals, which are information signals from a microphone (1010). The output of the microphone (1010) is amplified (1020) to provide an audio-frequency signal to a speech processor (1030).

The speech processor (1030) converts audio waveforms from the microphone (1010) into in-phase and phase-quadrature components suitable for input to the amplifier (10). The speech processor might provide signals that would produce signal sideband (SSB) modulation. It might also provide more complex speech compression and digitization for higher level digital modulation. The local oscillator (1040) provides the carrier frequency $f_c$ provided by the local oscillators (50 and 60) shown in FIG. 1. The output of the amplifier (10) is coupled to a suitable antenna (1070).

It should be pointed out that in the amplifier shown in FIG. 1 and used in FIG. 2, output signal amplification is maximized and adjacent channel signal splatter is minimized by sampling output signals, (which are at radio frequencies), shifting these to back to baseband and using baseband signals to control signal levels input to the final amplifier.

What is claimed is:

1. A feedback amplifier circuit, having controlled adjustment of input signal levels from a signal source according to the rate of occurence of an error signal level excursion beyond a reference level, said amplifier circuit comprised of:

first amplifier means, having an input and an output, for providing at said output, signals that are substantial amplifications of signals input to said amplifier means;

feedback element means, having an input and an output, for providing at said output, a signal representative of a signal at said input, said input of said feedback element being coupled to said output node of said amplifier means;

first summer means, having at least first and second inputs and an output, said first input of said first summer means coupled to said output of said feedback element means, said first summer means producing an error-indication output signal at said output that is substantially equal to the algebraic difference of signals at said first and second inputs, said output of said first summer means being coupled to said input of said amplifier means;

sampling means, coupled to said output of said first summer means, for providing a first control signal, indicative of error signal levels;

counting means, coupled to said sampling means, for measuring the rate of occurence of excursions beyond a reference level;

input level control means having an input that receives an input signal to be amplified by said amplifier circuit, for producing a first intermediate signal at an output that is proportional to said input signal, said input level control means being coupled and responsivie to the output of said counting means, said output of said input level control means being coupled to said second input of said first summer means.

2. The amplifier circuit of claim 1 where said first amplifier means is an operational amplifier.

3. The amplifier circuit of claim 1 where said first amplifier means is a differential amplifier.

4. The amplifier circuit of claim 1 where said feedback element means is an attenuator.

5. The amplifier circuit of claim 1 where said feedback element means is a resistance.

6. The amplifier circuit of claim 1 where said sampling means is a threshold comparator providing an output signal when said error signal exceeds a threshold value.

7. The amplifier circuit of claim 1 where said sampling means, provides a first control signal, that is dependent upon the absolute value of the output of said first summer means.

8. The amplifier circuit of claim 1 where said input level control means is further comprised of:
counting means for counting occurences of error signals exceeding a predetermined threshold value;
scaling means, coupled to said counting means, for adjusting the level of said input signal to be amplified by said amplifier circuit, in response to said counting means.

9. The amplifier circuit of claim 8 where said counting means is a computer.

10. The amplifier circuit of claim 8 where said scaling means for adjusting the level of said input signal is a scalable digital to analog converter.

11. An amplifier circuit for reducing adjacent frequency signal splatter from information signals transmitted on RF channels having adjacent frequency RF channels, said information having a relatively high peak signal value to average signal value ratio, said amplifier circuit comprised of:
means for scaling information signals, said first means for scaling signals having an input for signals, an output for scaled input signals, and a control input for control signals, said control signals changing the magnitude of signals output from said output, said scaling means coupled to receive information signals;
first summing means, having first and second inputs and an output, said first input of said first summing means coupled to said output of said first means for scaling signals;
first sampling means coupled to the output of said first summing means, for generating a first train of pulses the frequency of which varies with occurences of signals output from said first summing means that exceed a predetermined threshold;
inverting amplifier means having an input and an output for inverting and amplifying signals at said input, said amplifier coupled to the outputs of said first summing means;
counting means, coupled to said first sampling means, for counting said first train of pulses, and for generating a control signal to said control input of said first means for scaling information signals so as to reduce the output level of signals from first means for scaling information signals when the frequency of said first train of pulses exceeds a first predetermined rate, and so as to increase the output levels of signals from said first means for scaling information signals when the frequency of said first train of pulses is less than a second predetermined rate;
sampling attenuator means having an input coupled to the output of said amplifier means and having an output, said output of said sampling attenuator coupled to said second input of said first summing means; said sampling attenuator means for sampling a portion of output signals from said amplifier means.

12. The counting means of the amplifier circuit of claim 11 wherein said first and second predetermined rates are substantially equal.

13. A radio communications system for transmitting information signals on a radio frequency (RF) channels that have adjacent frequency RF channels, said radio transmitter having reduced adjacent RF channel distortion and being comprised of:
means for generating an information bearing signal;
means for converting said information bearing signal to in-phase (I) and phase-quadrature (Q) components;
means for transmitting said I and Q compenents comprised of:
first scaling means for scaling I components having an input, an output, and an input for scaling control signals, said scaling control signals changing the magnitude of I signals output from said first means for scaling I components;
second scaling means for scaling Q components having an input, an output, and an input for scaling control signals, said scaling control signals changing the magnitude of Q signals output from said second means for scaling Q components;
first and second summing means, each of said first and second summing means having first and second inputs and an output, said first input of said first summing means coupled to said output of said first scaling mean so as to receive I components, said first input of said second summing means coupled to said output of said second scaling means to receive Q components;
first and second modulator means each having an input and an output, for frequency shifting a signal at said input to a higher frequency at said output, said input of said first modulator coupled to the output of said first summing means, said input of said second modulator coupled to the output of said second summing means;
amplifier means having an input and an output for inverting and amplifying a signal at said input to said output, said input of said amplifier means being coupled to the outputs of said first and second modulator means;
first sampling means, having an input and an output, said input coupled to said output of said amplifier means, for producing a first feedback signal at said output that is a predetermined portion of the signal at said output of said amplifier means;

third and fourth modulator means each having an input and an output, for frequency shifting a signal at said input to a lower frequency at said output, said inputs of said third and fourth modulator means being coupled to the output of said sampling means, said output of said third modulator coupled to said second input of said first summing means, said output of said fourth modulator coupled to said second input of said second summing means, output signals from said third and fourth modulator means being at substantially the same frequency as signals output from said means for scaling I and Q components;

second sampling means coupled to the output of said first and second summing means, for generating a first train of pulses the frequency of which varies with the occurences of signals from said first and second summing means that exceed a predetermined threshold;

counting means, coupled to said second sampling means, for counting said first train of pulses, and for generating a control signal to said control input of said means for scaling I and Q components so as to reduce the output level of signals from first and second means for scaling information signals when the frequency of said first train of pulses exceeds a first predetermined rate, and so as to increase the output levels of signals from said first and second means for scaling information signals when the frequency of said first train of pulses is less than a second predetermined rate.

14. The radio communications system of claim 13 where first predetermined rate and second predetermined rate of said counting means means are substantially equal.

* * * * *